(12) United States Patent
Pace et al.

(10) Patent No.: US 6,323,649 B1
(45) Date of Patent: Nov. 27, 2001

(54) MODULAR MRI GRADIENT AMPLIFIER USING UNIPOLAR PWM DRIVE

(75) Inventors: Steven D. Pace, Maldon (GB); Michael Burl, Chargrin Falls; Douglas M. Blakeley, Euclid, both of OH (US)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/395,652

(22) Filed: Sep. 14, 1999

(51) Int. Cl.⁷ .................................................. G01V 3/00
(52) U.S. Cl. .......................................... 324/322; 324/318
(58) Field of Search .................... 324/320, 321, 324/322, 318, 309, 307; 363/98; 330/10

(56) References Cited

U.S. PATENT DOCUMENTS

| | | | |
|---|---|---|---|
| 5,270,657 | 12/1993 | Wirth | 324/322 |
| 5,442,290 | * 8/1995 | Crooks | 324/309 |
| 5,519,601 | 5/1996 | Close et al. | 363/98 |
| 5,721,490 | 2/1998 | Takano | 324/322 |
| 6,140,873 | * 10/2000 | Van Groningen | 330/10 |

FOREIGN PATENT DOCUMENTS

| | | |
|---|---|---|
| 0 454 298 A2 | 10/1991 | (EP) . |
| WO 98/41881 | * 9/1998 | (GB) . |

OTHER PUBLICATIONS

Klaassens et al., article "Series–Resonant Energy Conversion with Multi-Segment Current Waveforms for bipolar Energy Flow," IEEE PESC 1988 Record (Apr. 1988) pp. 599–608.*

SGS–Thomson product spec sheets N–Channel Enhancement Mode Power MOS Transistor in ISOTOP Package, Jul. 1993, pp. 325–330.

MG300J1US1, MG300J2YS9 product spec sheets for Silicon N–Channel IGBT, pp. 229–233.

O.M. Mueller, et al., "A GTO Speed–Up Inverter for Fast–Scan Magnetic Resonance Imaging," *Conf. Proc. IEEE*, pp. 479–486, 1992.

(List continued on next page.)

*Primary Examiner*—Jay Patidar
*Assistant Examiner*—Tiffany A. Fetzner
(74) *Attorney, Agent, or Firm*—Fay, Sharpe, Fagan, Minnich & McKee, LLP (57) ABSTRACT

A gradient amplifier (20), for driving a gradient coil (22) of an MRI scanner, includes a plurality of first modules (60). The first modules (60) provide unipolar PWM control of an input supplied thereto to generate a unipolar waveform. A high voltage DC power supply (64) electrically connected to the first modules (60) supplies the input to the first modules (60). At least one second module (140a, b) is electrically connected to the first modules (60). The second module (140a, b) selectively provides polarity switching of the unipolar waveform output from the first modules (60) to generate a bipolar waveform which drives the gradient coil (22).

24 Claims, 11 Drawing Sheets

OTHER PUBLICATIONS

P.L. Mondino, et al., "The High Power, Wide Bandwidth Disruption Feedback Amplifiers for Jet," *Fusion Technology*, pp. 1624–1628, (1990).

S.M. Tenconi, et al., "High Power, Wide Bandwidth Linear Switching Amplifier Using IGBTs," *IEEE*, pp. 778–785, (1993).

F.M. Flinders, et al., "Improved Techniques for Switching Power Amplifiers," *IEEE Transactions on Power Electronics*, pp. 673–679, vol. 8, No. 4, (Oct. 1993).

W.A. Cronje, et al., "Adjusting Circuit Parasitics to Optimize Converter Switching Transient Behavior," *IEEE*, pp. 1082–1088, (Jan. 1992).

M. Marchesoni, et al., "A Non Conventional Power Converter for Plasma Stabilization," *PESC Record IEEE*, pp. 122–129, (Apr. 1988).

H. Fukuda, et al., "State–Vector Feedback Control based High–Frequency Carrier PWM Power Conversion Amplifier with High=Precision Magnetic–Field Current–Tracking Scheme," *The European Power Electronics Association*, pp. 11–16, (1993).

* cited by examiner

MODULAR MRI GRADIENT AMPLIFIER USING UNIPOLAR PWM DRIVE

BACKGROUND OF THE INVENTION

The present invention relates to the art of electrical amplifiers. It finds particular application in conjunction with driving gradient coils in magnetic resonance imaging (MRI) scanners, and will be described with particular reference thereto. However, it is to be appreciated that the present invention is also amenable to other like applications.

In MRI, a substantially uniform temporally constant main magnetic field, $B_0$, is generated within an examination region. The main magnetic field polarizes the nuclear spin system of a subject being imaged within the examination region. Magnetic resonance is excited in dipoles which align with the magnetic field by transmitting radio frequency (RF) excitation signals into the examination region. Specifically, RF pulses transmitted via an RF coil assembly tip the dipoles out of alignment with the main magnetic field and cause a macroscopic magnetic moment vector to precess around an axis parallel to the main magnetic field. The precessing magnetic moment, in turn, generates a corresponding RF magnetic resonance signal as it relaxes and returns to its former state of alignment with the main magnetic field. The RF magnetic resonance signal is received by the RF coil assembly, and from received signals, an image representation is reconstructed for display on a human viewable display.

The appropriate frequency for exciting resonance in selected dipoles is governed by the Larmor equation. That is to say, the precession frequency of a dipole in a magnetic field, and hence the appropriate frequency for exciting resonance in that dipole, is a product of the gyromagnetic ratio $\gamma$ of the dipole and the strength of the magnetic field. In a 1.5 T magnetic field, hydrogen ($^1H$) dipoles have a resonance frequency of approximately 64 MHZ. Generally in MRI, the hydrogen species is excited because of its abundance and because it yields a strong MR signal.

To spatially or otherwise encode the magnetic resonance, MRI systems employ gradient coil assemblies that are typically pulsed with electrical current pulses to produce magnetic gradients across the main magnetic field in the vicinity of the imaging region. For different imaging experiments, various waveforms are used to generate the desired gradient pulse sequence. The effect of the gradient pulse is to locally modify the frequency and/or phase of the nuclear magnetic resonance (NMR) signal through a change in magnitude of a z component of the main magnetic field, $B_o$. With stronger gradient strength, higher resolution is realized in an acquired image. It is therefore desirable to have an amplifier which can deliver high levels of current and/or voltage to the resistive and/or inductive loads represented by the gradient coils. Moreover, as different imaging experiments call for different gradient pulse sequences produced by current pulses having various waveforms, it is advantageous for the amplifier be able to arbitrarily generate any desired waveform.

Early amplifiers used to supply current to gradient coils were analogue, both vacuum and solid state, and hence dissipated considerable heat. Later solid state four quadrant amplifiers were made using pulse width modulation (PWM) techniques.

Previously implemented amplifiers include linear, PWM (see, for example, U.S. Pat. No. 5,519,601 to Close et al.), hybrid speed-up schemes (see, for example, Mueller et al., "A GTO Speed-Up Inverter for Fast-Scan Magnetic Resonance Imaging," *Conf. Proc. IEEE*, (1992), pp. 479–486), and stepped modulation. However, while linear amplifiers provide low noise, high fidelity, and large control bandwidths, they are intrinsically inefficient driving an inductive load. Therefore, they use large amounts of silicon.

A four quadrant PWM scheme (i.e., a full bridge configuration) using metal-oxide-semiconductor field-effect transistor (MOSFET) or insulated gate bipolar transistor (IGBT) type devices can provide large amounts of power more efficiently than linear designs, but it takes special care to achieve low noise or high fidelity. Additionally, this PWM design is fundamentally limited on voltage unless a large number of devices are combined into an array.

Speed-up type amplifiers use large storage capacitors and a simple switch in combination with a standard linear amplifier serving as a regulator. This provides high voltages, but only limited control of the waveform transitions.

With stepped modulation, stacks of multiple four quadrant PWM amplifiers are used to achieve the full voltage range desired for MRI. This is cumbersome and in effect costly, particularly considering that only half the silicon in each full bridge is utilized at a time.

The present invention contemplates a new and improved amplifier for driving MRI gradient coils which overcomes the above-referenced problems and others.

SUMMARY OF THE INVENTION

In accordance with one aspect of the present invention, a gradient amplifier for driving a gradient coil of an MRI scanner is provided. The gradient amplifier includes a number of first modules which provide unipolar PWM control of an input supplied thereto to generate a unipolar waveform. A high voltage DC power supply electrically connected to the first modules supplies the input to the first modules. At least one second module is electrically connected to the first modules. The second module selectively provides polarity switching of the unipolar waveform output from the first modules to generate a bipolar waveform which drives the gradient coil.

In accordance with a more limited aspect of the present invention, each first module includes a half bridge configuration of switching devices.

In accordance with a more limited aspect of the present invention, the switching devices are controlled via isolating drive transformers.

In accordance with a more limited aspect of the present invention, the switching devices are selected from power MOSFETs, IGBTs, thyristors and bipolar power transistors.

In accordance with a more limited aspect of the present invention, each first module further includes an electrical filter which filters the input from the high voltage DC power supply. The electrical filter is made up of an inductor assembly and a capacitance. The capacitance further operates to locally store energy in the first modules for use thereby.

In accordance with a more limited aspect of the present invention, the first modules are electrically connected in parallel such that each first module shares a portion of a total current through the gradient coil.

In accordance with a more limited aspect of the present invention, the first modules are electrically connected in series such that the first modules have a composite output voltage which is a vector sum of their individual output voltages.

In accordance with a more limited aspect of the present invention, the gradient amplifier further includes a ground connection which electrically grounds a midpoint between series connected first modules.

In accordance with a more limited aspect of the present invention, diodes are connected in anti-parallel with the switching devices.

In accordance with a more limited aspect of the present invention, the second module includes a full bridge configuration of switching devices.

In accordance with a more limited aspect of the present invention, the switching devices are selected from IGBTS, bipolar power transistors, power MOSFETs, thyristors, and GTO thyristors.

In accordance with a more limited aspect of the present invention, a maximum output of the gradient amplifier is selectively changed by varying the number first modules.

In accordance with another aspect of the present invention, a method of generating magnetic gradients in a main magnetic field of an MRI scanner is provided. The method includes generating a high voltage DC current. The high voltage DC current is pulse width modulated to produce a unipolar waveform. A polarity of the unipolar waveform is selectively reversed to generate a bipolar waveform. Ultimately, the bipolar waveform is applied to a gradient coil of the MRI scanner.

In accordance with a more limited aspect of the present invention, pulse width modulating the high voltage DC current includes controlling a plurality of switching devices which are divided into separate electrically connected modules. Each module includes a half bridge configuration of switching devices.

In accordance with a more limited aspect of the present invention, the step of controlling includes driving the plurality of switching devices with isolating drive transformers.

In accordance with a more limited aspect of the present invention, the step of controlling includes using a non-floating electrical supply to control the plurality of switching devices.

In accordance with a more limited aspect of the present invention, the pulse width modulating has a duty cycle of between 0 and 100% inclusive.

In accordance with a more limited aspect of the present invention, the method further includes filtering the high voltage DC current within each of the separate modules, and storing energy from the high voltage DC current locally within each of the separate modules for use thereby.

In accordance with a more limited aspect of the present invention, the method further includes storing regenerated energy from the gradient coil locally within each of the separate modules for use thereby.

In accordance with a more limited aspect of the present invention, the modules are electrically connected in one of series, parallel, or both series and parallel.

In accordance with a more limited aspect of the present invention, the method further includes grounding series connected modules at their electrical midpoint.

In accordance with a more limited aspect of the present invention, the method further includes protecting the separate modules from excessive amounts of the high voltage DC current.

In accordance with a more limited aspect of the present invention, selectively reversing the polarity of the unipolar waveform includes controlling a plurality of switching devices which are divided into separate electrically connected modules. Each module includes a full bridge configuration of switching devices.

One advantage of the present invention is that it maximizes the use of available silicon.

Another advantage of the present invention is that it uses approximately half as much silicon as a comparable stepped modulation amplifier, thereby lowering costs, reducing the number of circuit components, and reducing space requirements.

Yet another advantage of the present invention is that it generates arbitrary waveforms (including DC) as desired for more flexibility in the definition of the gradient pulse sequence.

Another advantage of the present invention is its modular design which facilitates field maintenance, eases upgrades, and allows for graceful degradation without total failure of the amplifier.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
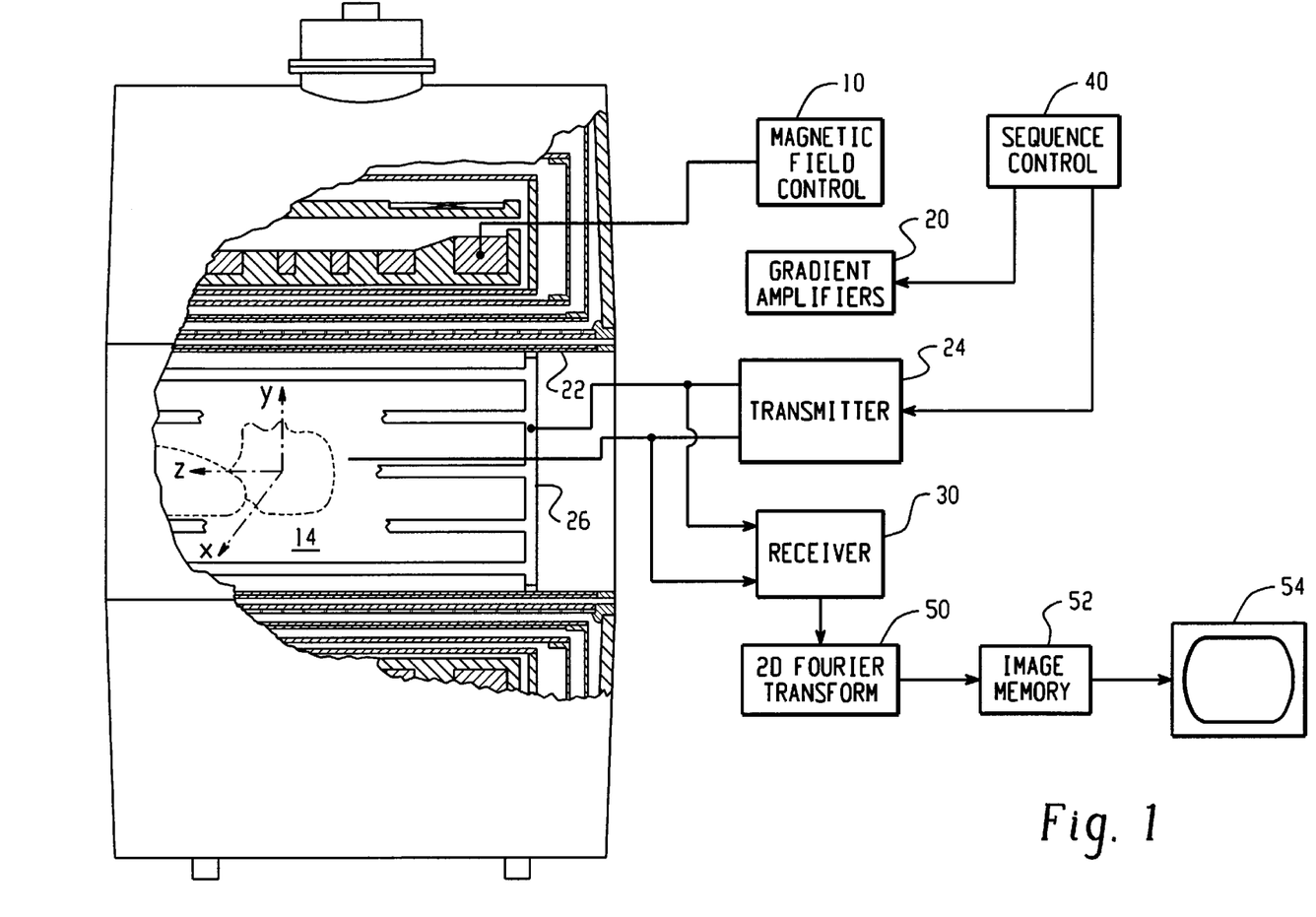
FIG. 1 is a diagrammatic illustration of a magnetic resonance imaging apparatus in accordance with aspects of the present invention.

With reference to FIG. 1, a main magnetic field control 10 controls superconducting or resistive magnets 12 such that a substantially uniform temporally constant main magnetic field, $B_0$, is created along a z axis through an examination region 14. A couch (not illustrated) suspends and/or positions an object to be examined, such as a patient or phantom, within the examination region 14. A magnetic resonance echo means applies a series of RF and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging sequences. More specifically, gradient pulse amplifiers 20 apply current pulses to selected ones or pairs of gradient coil assemblies 22 to create magnetic field gradients along x, y, and z axes of the examination region 14. A RF transmitter 24 drives a whole-body RF coil 26 to transmit RF pulses or pulse packets into the examination region 14. A typical RF pulse is composed of a packet of immediately contiguous pulse segments of short duration, which taken together with each other and any applied gradients, achieve a selected magnetic resonance manipulation. For whole-body applications, the resonance signals or echos are commonly picked up by the whole-body RF coil 26.

For generating images of local regions of the subject, specialized RF coils are placed contiguous to the selected region of interest. For example, an insertable RF coil may be inserted surrounding a selected region at the isocenter of the bore. The insertable RF coil is used to excite magnetic resonance and receive magnetic resonance signals emitted from the patient in the region being examined. Alternatively, the insertable RF coil can be used to only receive resonance signals introduced by the whole-body RF coil 26. In any event, the resultant RF signals are picked up by the whole-body RF coil 26, the insertable RF coil, or other specialized RF coil and demodulated by a receiver 30, preferably a digital receiver.

A sequence control circuit 40 controls the gradient pulse amplifiers 20 and the transmitter 24 to generate any of a plurality of multiple echo sequences such as gradient and spin echo (GSE) imaging, fast spin echo (FSE) imaging, single shot FSE imaging, and the like. For the selected sequence, the receiver 30 receives a plurality of data lines in rapid succession following each RF excitation pulse. Ultimately, the RF signals are received, demodulated, and reconstructed into an image representation by a reconstruction processor 50 which applies a two-dimensional (2D) Fourier transform or other appropriate reconstruction algorithm. The image may represent a planar slice through the patient, an array of parallel planar slices, a three-dimensional volume, or the like. The image is then stored in an image memory 52 where it is accessed by a display, such as a video monitor 54 or other human viewable display or output device that provides a rendering of the resultant image.

While the invention herein is described with reference to the MRI apparatus detailed above, it is appreciated that the invention is applicable to other MRI apparatus. For example, the invention is equally amenable to open geometry magnets wherein opposing pole pieces, joined by a ferrous flux return path, define an examination region therebetween.

Figure 2:
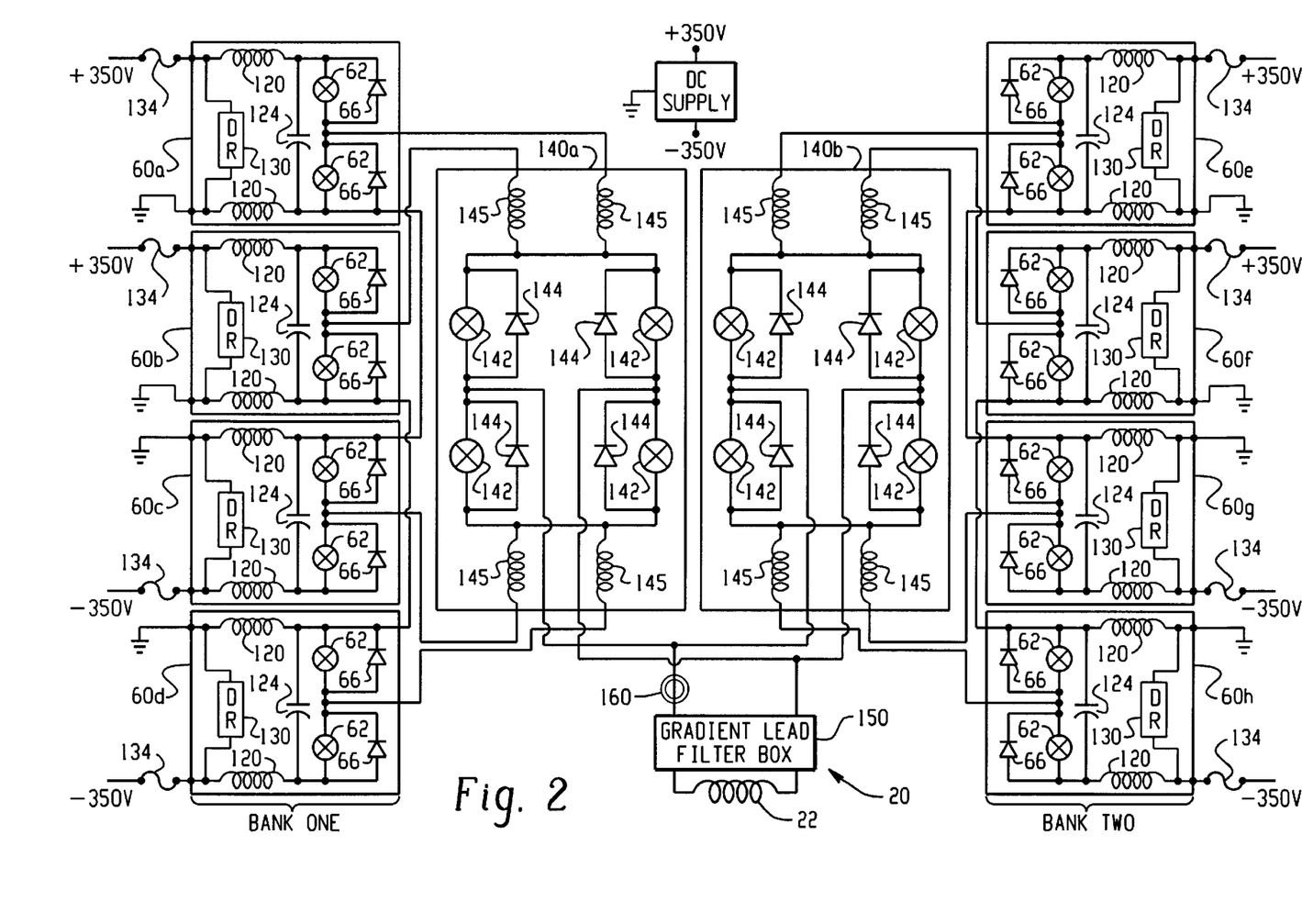
FIG. 2 is an electrical circuit diagram of a gradient amplifier in accordance with aspects of the present invention.
Figures 3A, 3D:
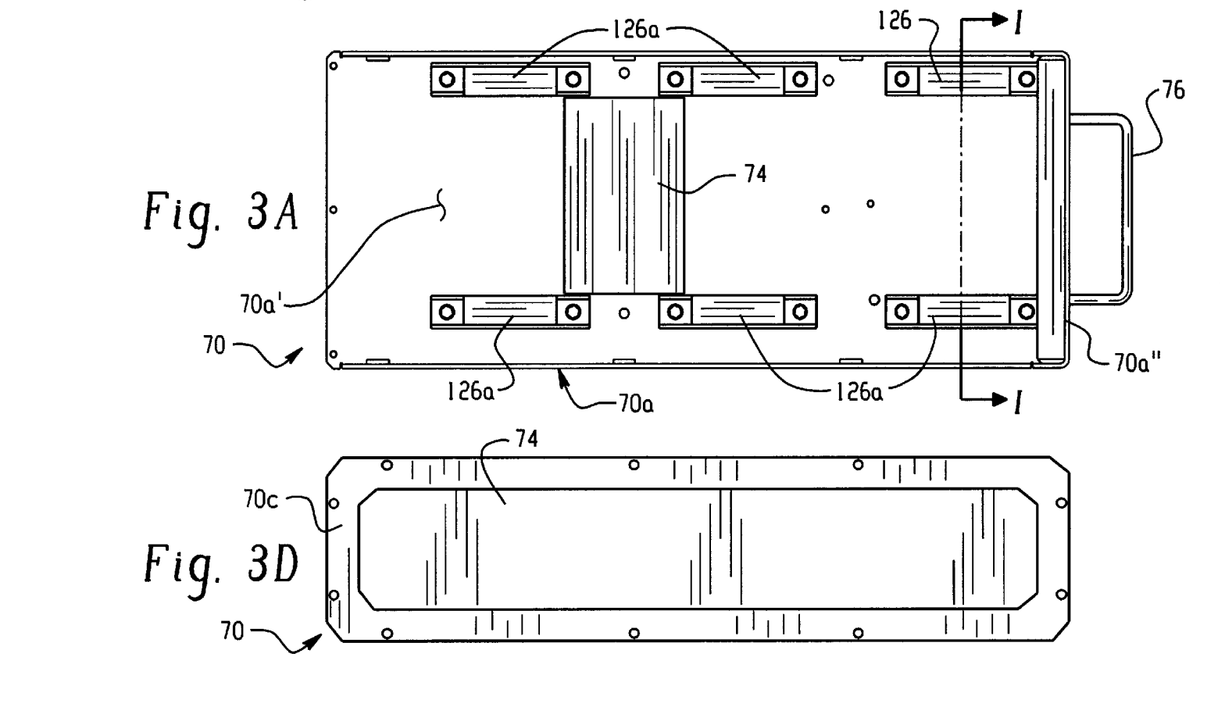
FIG. 3A is a bottom plan view of a top plate for a housing of a first module of a gradient amplifier in accordance with aspects of the present invention.
FIGS. 3C and 3D are side elevation views of interior sides of the housing's opposing side plates in accordance with aspects of the present invention.
Figure 3B:
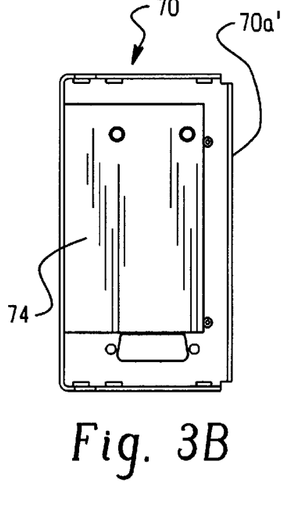
FIG. 3B is a cross-sectional view of the top plate in FIG. 3A taken along section line I—I.
Figure 3C:
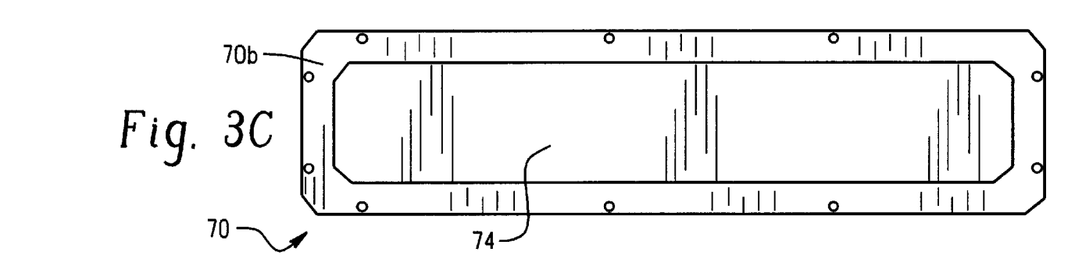

In any event, with reference to FIG. 2 and continuing reference to FIG. 1, a modular gradient amplifier 20 is used for driving a gradient coil 22 with an arbitrary waveform as desired for the particular imaging experiment being undertaken. The gradient amplifier 20 includes a plurality of selectively installable modules. Gradient amplifier upgrades are accomplished simply through installation of additional modules which in turn increase the amplifier's performance potential in predetermined increments. Conversely, removal of modules degrades the amplifier's performance potential in predetermined increments. Overall, the modularity, enhances the ease of maintaining the gradient amplifier 20 in the field by simple replacement of failed modules, and/or, in the alternative, permits graceful degradation without total failure by electrically disabling or removal of only those modules that are faulty.

More specifically, as best seen in FIG. 2 which shows a preferred embodiment, there are two banks (i.e., bank one and bank two) containing collectively eight first modules 60a–h that employ half-bridge configurations of switching devices 62 to pulse width modulate (PWM) an input high voltage DC current from a regulated or otherwise standard high voltage DC power supply 64. Preferably, the switching devices are power MOSFETs, or alternately, thyristors, bipolar power transistors, small IGBTs, or other like switches which are optionally limited in their voltage, current, or power rating but provide fast precision control. In a preferred embodiment, intrinsic diodes 66 present in the switching devices are electrically connected in anti-parallel across the switching devices 62 of the first modules 60a–h. Optionally, diodes connected externally to the switching devices 62 are employed for this purpose. The output signal from the first modules 60a–h is a unipolar waveform. As illustrated, first modules 60a and 60c; 60b and 60d; 60e and 60g; and, 60f and 60h are electrically connected in series, respectively. Additionally, as illustrated, first modules 60a and 60b; 60c and 60d; 60e and 60f; and, 60g and 60h are electrically connected in parallel, respectively.

Series connection of the first modules 60 increases the voltage capabilities of the gradient amplifier 20. That is to say, depending on the voltage capability desired for a particular implementation, more or less first modules 60 are optionally electrically connected in series. In a preferred embodiment, for example, each first module is rated for 350V such that two stacked in series, as illustrated, produces a gradient amplifier rated for 700V. In this manner, the composite pulsed output of the series stacked first modules 60 is the vector summation of the individual outputs. Higher voltages are achievable by stacking additional first modules 60 in a series manner, for example, four first modules 60 rated for 350V are connected in series to produce a gradient amplifier rated for 1400V. Moreover, preferably, a ground connection electrically grounds a midpoint between series connected first modules 60 thereby limiting the voltage potential to ground for the modules in the series and the gradient coil load.

Parallel connection of the first modules 60 increases the current capabilities of the gradient amplifier 20. That is to say, depending on the current capability desired for a particular implementation, more or less first modules 60 are optionally electrically connected in parallel to share the total current load between the first modules 60. In a preferred embodiment, for example, each first module 60 is rated for 110A such that two stacked in parallel, as illustrated in each bank of first modules 60, generates a bank rated for 220A. Accordingly, for this example, the gradient amplifier illustrated, including the parallel configuration of bank one and bank two, is rated for 440A. Higher currents are achievable through connection of additional first modules 60 in a parallel manner.

Figure 8:
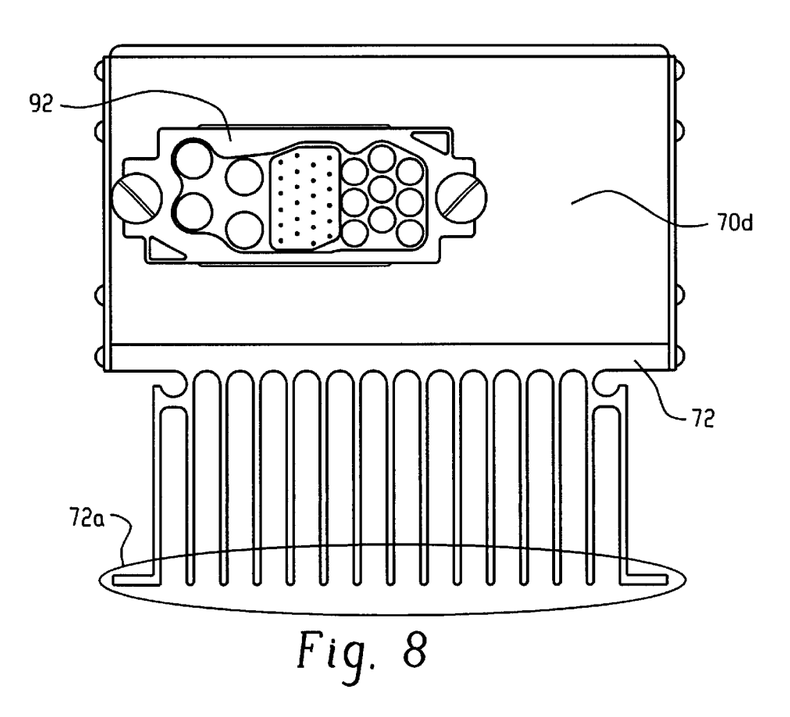
FIG. 8 is a back end elevational view of a first module of a gradient amplifier in accordance with aspects of the present invention.

With further reference to FIGS. 3A through 3D, physically each first module 60 is preferably contained within an outer housing 70. The outer housing 70 includes an L-shaped top plate 70a with a top portion 70a' and a front portion 70a", two side plates 70b and 70c, and a back plate 70d (see FIGS. 4A, 4B, and 8). A finned heatsink 72 (see FIGS. 5A, 5B, 7 and 8) acts as the bottom side of the housing 70. Insulators 74 are installed on the inside walls of the housing 70 to electrically insulate, from the housing 70, components that are proximate or secured thereto. A handle 76 is attached to the front portion 70a" of the top plate 70a of the outer housing 70 to facilitate installation and removal from the gradient amplifier 20, and to facilitate transporting or carrying of the first module 60 when removed.

With further reference to FIGS. 4A through 8 generally, each first module 60 includes one or more switching cells 80 having the half bridge configuration shown in FIG. 2. With particular reference to FIG. 5A, in a preferred embodiment, each first module includes three such switching cells 80 connected in parallel across a DC bus 90 (see FIG. 6B) via positive and negative leads 82. The DC bus 90 is electrically connected to outside components through a connector 92 extending through the back plate 70d of the outer housing 70. The outputs 84 of the switching cells 80 are collectively routed via lead assembly 94 to the connector 92 where they are accessed as the output from the first module 60. At each of the two switch positions within a switching cell 80, one or more (preferably two) switching devices 62 are connected in parallel to share the applied load.

The switches 62 are driven by isolating drive transformers 100a and 100b (see FIGS. 4A and 4B) which control, respectively, switches in the two switch positions within each switching cell 80. That is to say, drive transformer 100a controls all the switches in one switch position for all three switching cells 80, while drive transformer 100b controls all the switches in the other switch position for all three switching cells 80. The use of transformers permits direct drive of the switches 62 without the use of a floating auxiliary supply. In a preferred embodiment, a non-floating electrical supply is used to control the switches 62. Additionally, with the drive transformers 100a and 100b, a wide range of PWM duty cycles (0 to 100%) are made available. They allow optimization of the drive waveform characteristics to permit operation of the PWM signals down to zero pulse width.

Figure 4A:
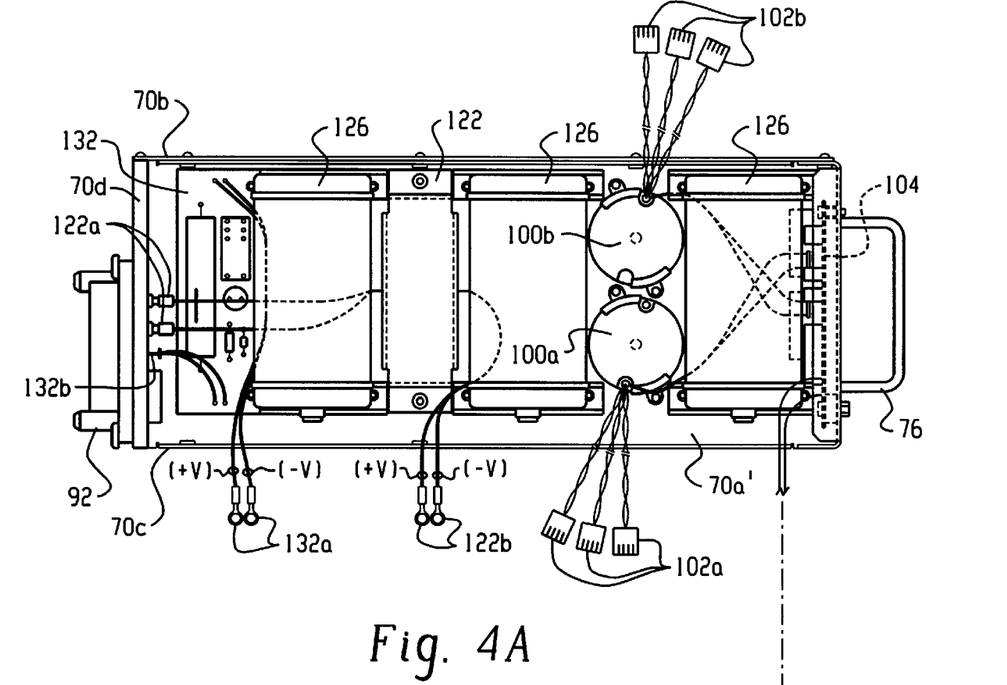
FIGS. 4A and 4B are bottom plan views of the top plate in FIG. 3A with selected components of a first module installed in accordance with aspects of the present invention.
Figure 4B:
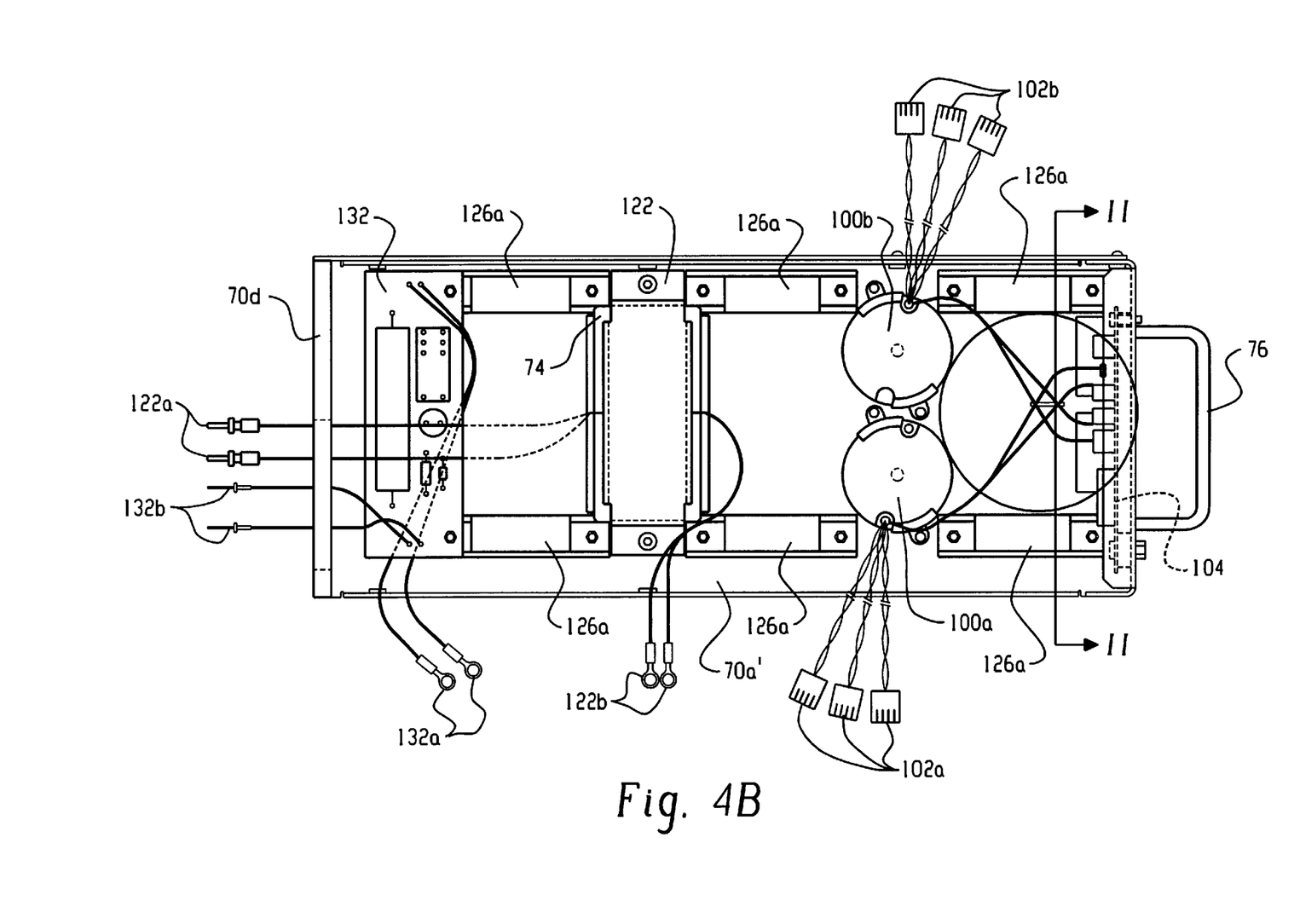

As best seen in FIGS. 4A and 4B, the drive transformers 100a and 100b are mounted to the top portion 70a' of the top plate 70a of the outer housing 70. Electrical connection between the drive transformer 100a and the switches 62 in the first position is accomplished via control leads 102a from transformer 100a which are connected to switch control input tabs 80a on the switching cells 80. Likewise, electrical connection between the drive transformer 100b and the switches 62 in the other position is accomplished via control leads 102b from transformer 102b which are connected to switch control input tabs 80b on the switching cells 80.

Figure 4C:
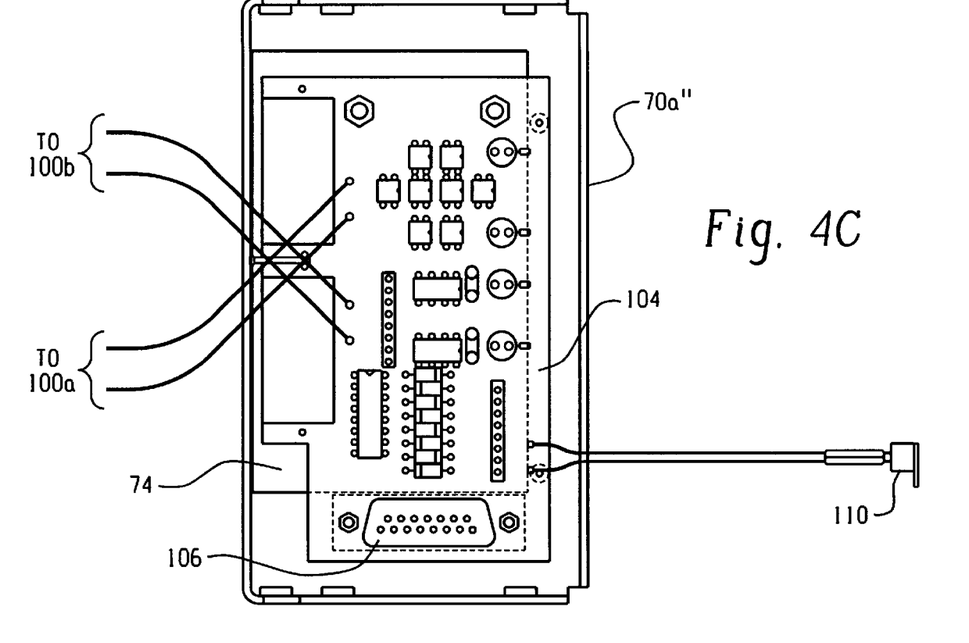
FIG. 4C is a cross-sectional view of the top plate in FIG. 4B taken along section line II—II.

As best seen in FIG. 4C, the drive transformers 100a and 100b are in turn commanded through a switch interface circuit on a printed circuit board (PCB) 104. The switch interface PCB 104 is mounted over an insulator 74 to the front portion 70a" of the top plate 70a of the outer housing 70. A pin connector 106 extending through the outer housing 70 connects the switch interface PCB 104 to the outside.

Figure 5A:
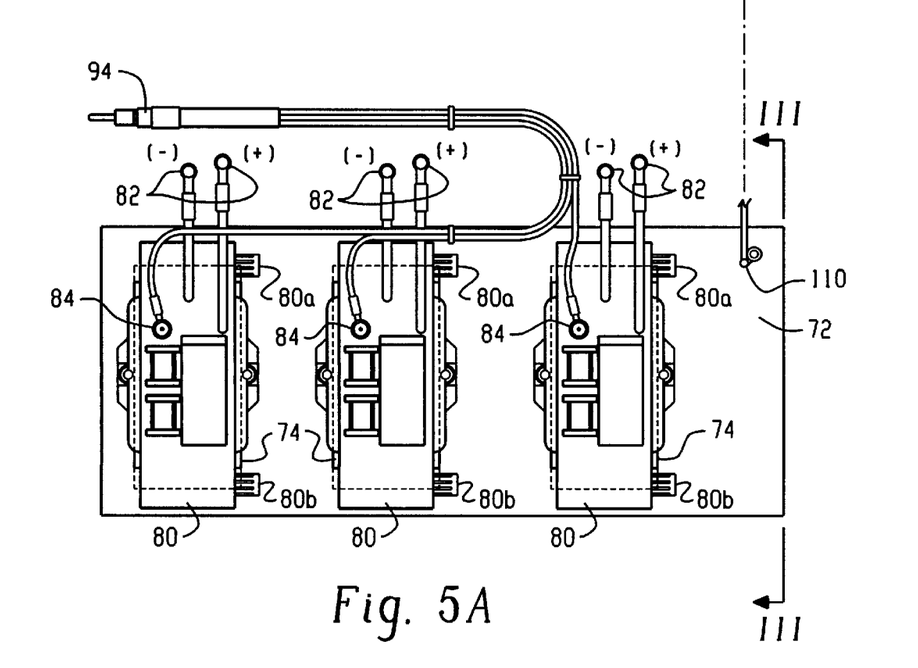
FIG. 5A is a top plan view of a heatsink with attached electrical components of a first module of a gradient amplifier in accordance with aspects of the present invention.
Figure 5B:
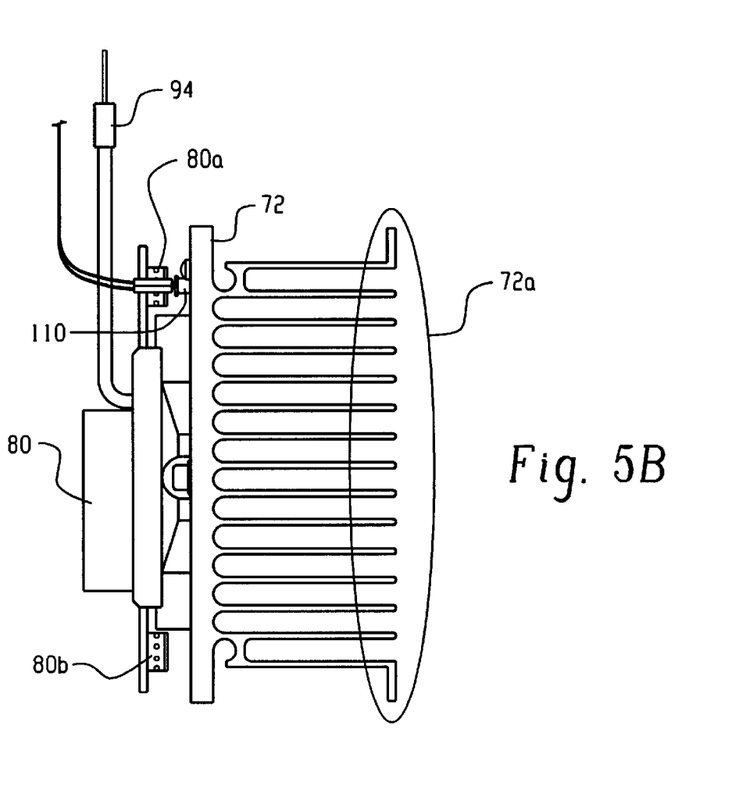
FIG. 5B is an elevational end view of the heatsink in FIG. 5A taken along section line III—III.
Figure 6A:
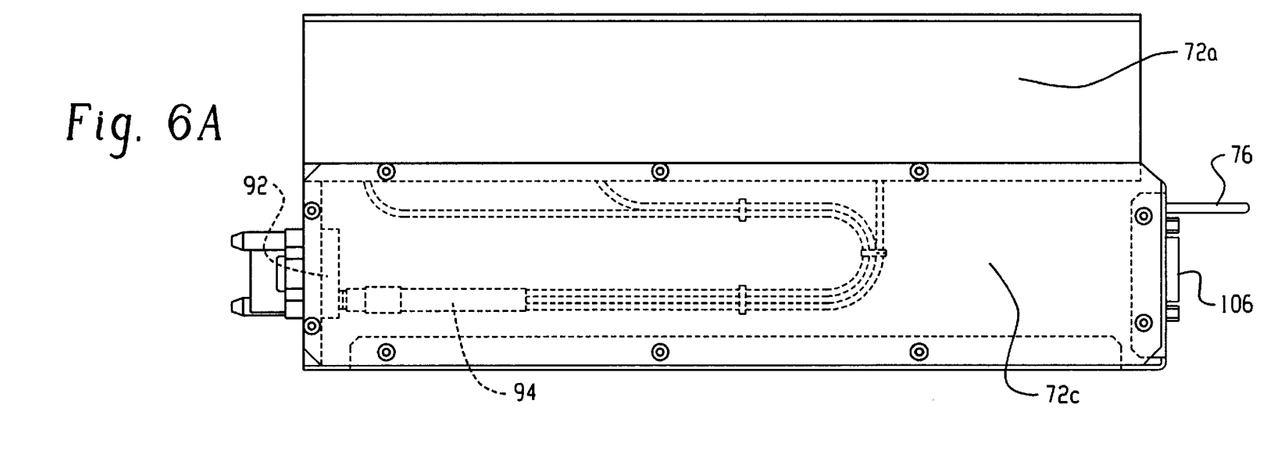
FIG. 6A is a side elevational view of a first module of a gradient amplifier in accordance with aspects of the present invention showing selected interior components with dotted lines.
Figure 6B:
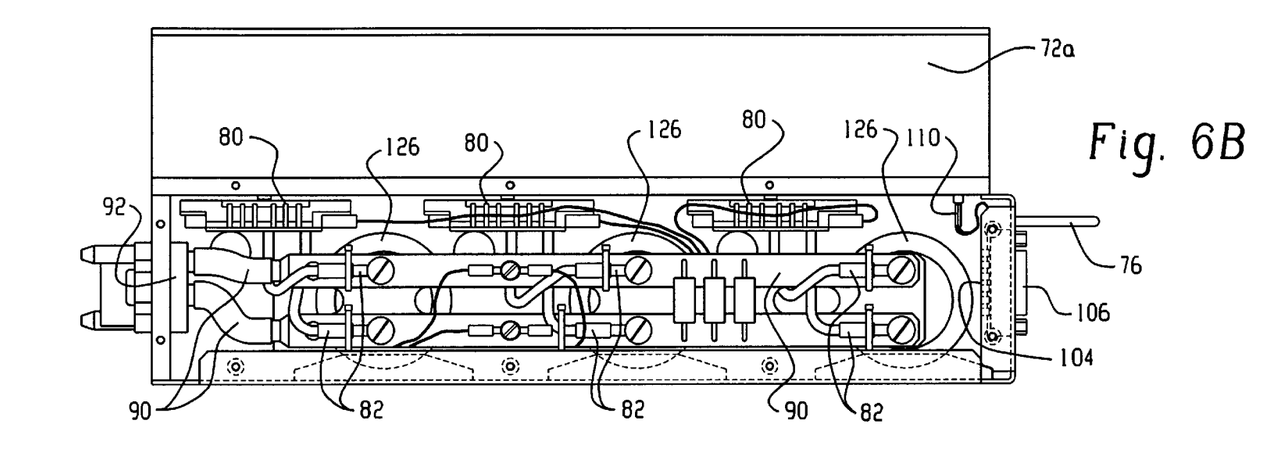
FIG. 6B is a partially cut away side elevational view showing interior components of the first module in FIG. 6A.
Figure 7:
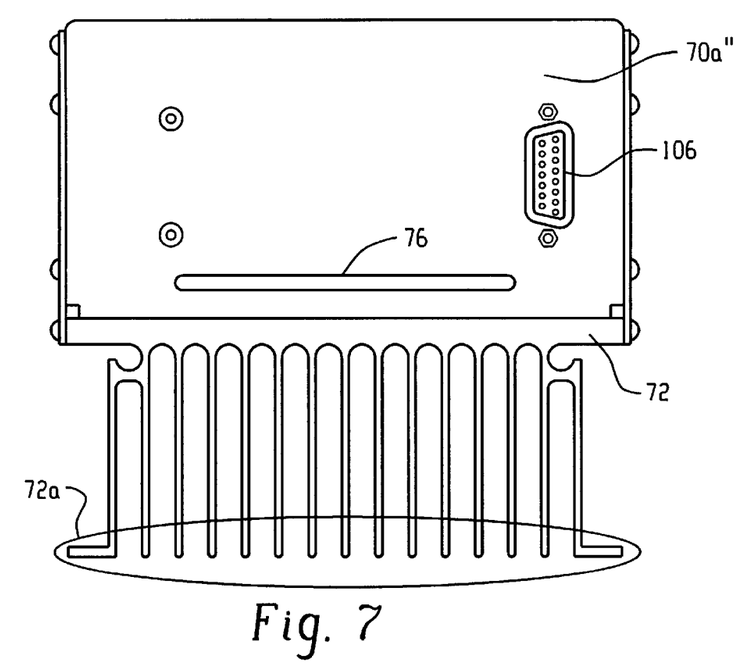
FIG. 7 is a front end elevational view of a first module of a gradient amplifier in accordance with aspects of the present invention.

As best seen in FIGS. 5A and 5B, the switching cells 80 are secured over insulators 74 to the heatsink 72 having a plurality of air cooled fins 72a on the outside thereof. Alternately, liquid cooling is employed. Optionally, to monitor and protect against overheating, a thermo-sensor 110 is mounted on the heatsink 72. It monitors the temperature of the heatsink 72 and returns electrical signals indicative thereof to the switch interface PCB 104. When potential overheating is detected in a first module 60, it is shutdown or other appropriate action is taken to prevent damage to the electrical components therein.

Each first module 60 carries its own input filter and local energy storage which are made up of inductive and capacitive elements. The input filter is made up of: (1) inductors 120 (see FIG. 2) included in an inductor assembly 122 (see FIGS. 4A and 4B); and, (2) a capacitance 124 (see FIG. 2) which is realized via capacitors 126 (see FIGS. 4A and 4B), preferably electrolytic capacitors. The input filtering contains bus line noise within the first modules 60 so that it does not travel down line where it potentially interferes with an imaging experiment.

The capacitance 124 also serves as the local energy storage. The local storage permits energy to be drawn locally rather than from the further up line DC supply 64. In effect then, the DC supply 64 charges up the capacitors 126, and energy is drawn from there when called. The capacitance 124 also serves to absorb energy regenerated by the inductive gradient coil 22 which is then available for reused by the modules.

The inductor assembly 122, is secured over an insulator 74 to the top portion 70a" of the top plate 70a of the outer housing 70. A pair of inductor assembly input leads 122a receive the input from the DC supply 64 via the connector 92 mounted in the back plate 70d of the outer housing 70. A pair of inductor assembly output leads 122b are electrically connected to the DC bus 90. In a 350V/110A first module 60, preferably 400 $\mu$H inductors are employed.

The capacitors 126 are held in capacitor clips 126a (best seen in FIGS. 3A–D) secured to the top portion 70a' of the top plate 70a of the outer housing 70. In a 350V/110A first module 60, preferably three 1500 $\mu$F capacitors 126 are employed. The capacitors 126 are electrically connected in parallel across the DC bus 90 of the first module 60.

Optionally, filtering and energy storage is accomplished commonly for all the first modules 60 collectively, via a separate array or board of inductors and capacitors not located on the individual modules 60. However, by each carrying their own filtering and local storage the first modules 60 have a higher degree of modularity. That is to say, in the later case, each first module 60 carries the desired filtering and energy storage to support itself. Therefore, rather than over specify a common board to accommodate the highest possible upgrade, the overall filtering and energy storage is always appropriate because each additional module has its own supporting filter and energy storage. Additionally, when carried by the separate first modules 60, failure of an inductor or capacitor in the filtering and/or energy storage circuit is simply remedied by replacing the module 60.

To discharge the storage capacitor after the DC supply is removed and protect personnel assembling or repairing the amplifier, each first module 60 carries a dump relay circuit 130 included on a PCB 132 (see FIGS. 2, 4A and 4B) which is mounted on the top portion 70a' of the top plate 70a of the outer housing 70. The dump relay circuit 130 is connected across the DC bus 90 via leads 132a and is controlled via leads 132b to the connector 92 in the back plate 70d of the housing 70. Preferably, in a 350V/110A first module 60, the dump relay circuit 130 includes a relay and a 1KΩ resistor in series. When DC power is applied to the first module 60 the relay is opened. When power is removed or a fault is detected in the amplifier 20, the relay is closed to safely shut down the module. The dump relay circuits 130 are also used to remove power from the first modules 60 when not in use for a predetermined period of time. This enhances the life of the capacitors 126 particularly when electrolytic capacitors are employed in the implementation. Additionally, as illustrated, overcurrent protection is optionally installed on the input lines to the first modules 60 from the DC supply 64 in the form of fuses or breakers 134.

With particular reference to FIG. 2, the unipolar waveform generated by the first modules 60a–h is applied, through sharing inductors 145, to second modules 140a and 140b which selectively reverse the polarity of the applied unipolar waveform to generate a bipolar waveform which is ultimately used to drive the gradient coil 22. Optionally, depending to the ratings or capabilities of components used in the second modules 140a and 140b, more or less second modules are added or subtracted as desired to handle more or less first modules 60. In the illustrated embodiment, the second modules 140a and 140b are connected in parallel and each handles one bank of first modules 60. Second modules 140a and 140b are connected in parallel to provide the full rated current of the amplifier 20 to the gradient coil 22.

The second modules 140a and 140b each include a full bridge configuration of switching devices 142. Preferably, the switching devices are IGBTs, or alternately, bipolar power transistors, power MOSFETs, thyristors, gate turn-off (GTO) thyristors, or other like switches which are optionally limited in their speed or control bandwidth but have high capacity for voltage, current, or power. In a preferred embodiment, intrinsic diodes 144 present in the switching devices 142 are electrically connected in anti-parallel across the switching devices 142. Optionally, external diodes may be employed for this purpose. Again, the output signal from the second modules 140a and 140b is a bipolar waveform.

Figure 9A:
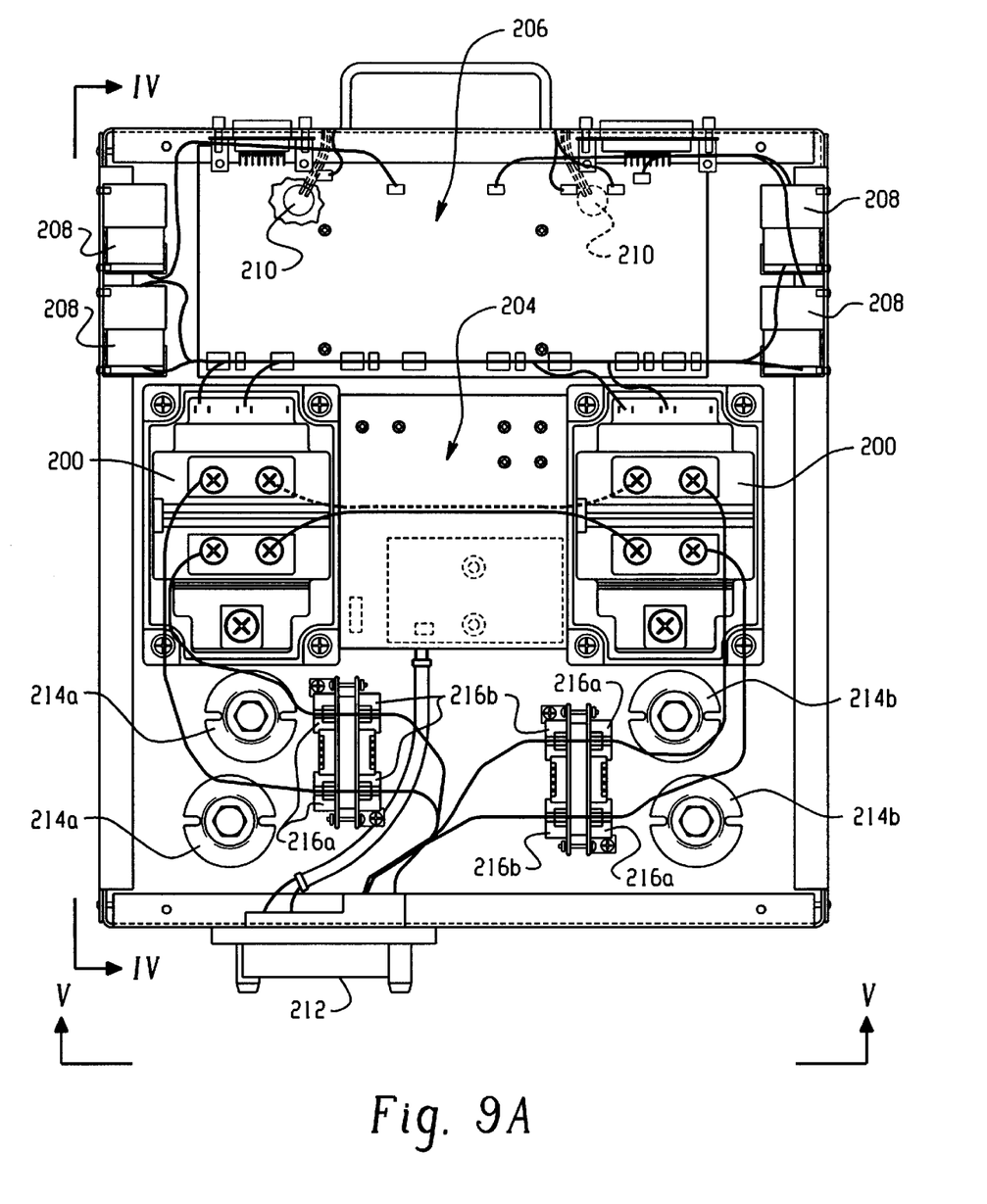
FIG. 9A is a top plan view of a second module of a gradient amplifier in accordance with aspects of the present invention showing selected interior components.
Figure 9B:
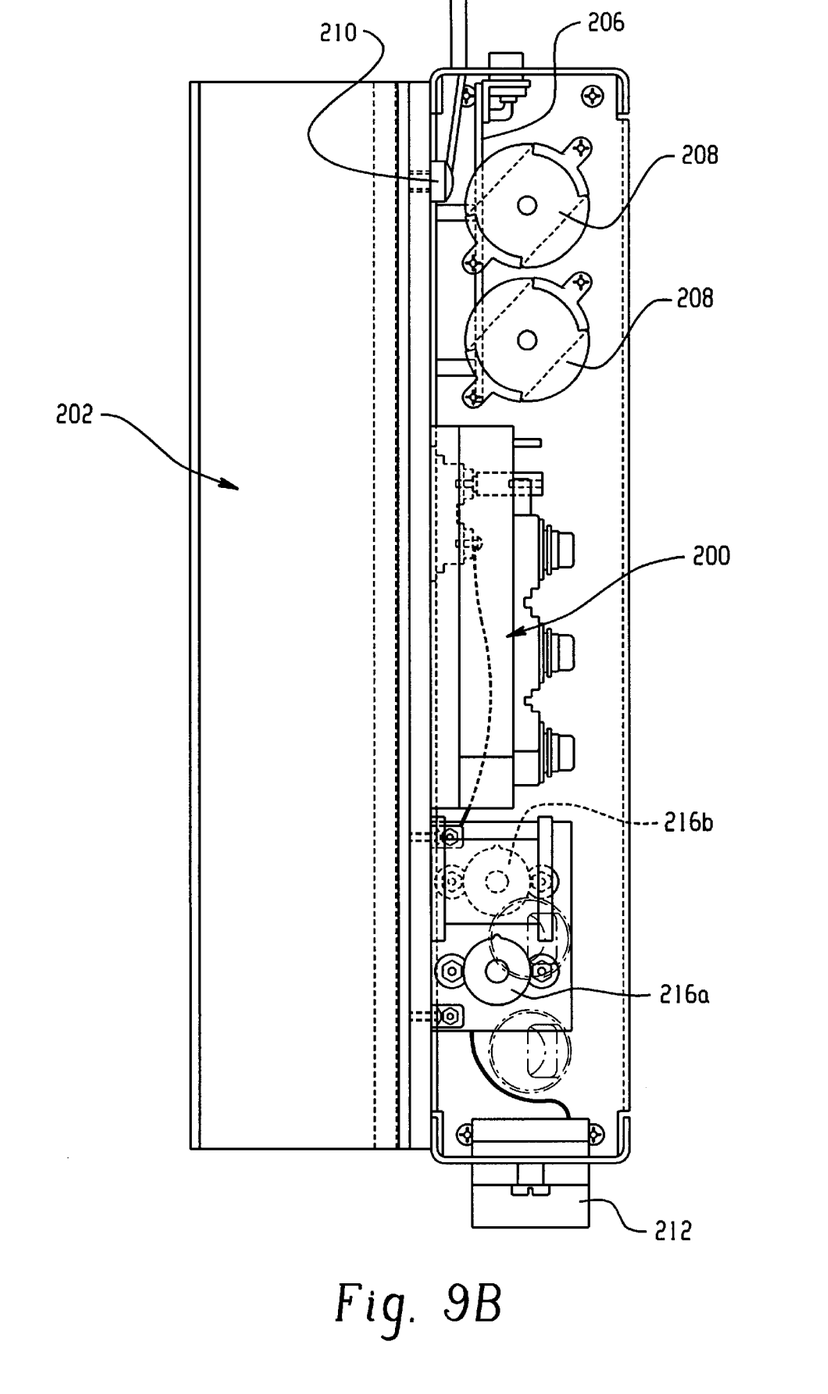
FIG. 9B is a partially cut away side elevational view of the second module in FIG. 9A taken along section line IV—IV; and, FIG. 9C is a partially cut away back end elevational view of the second module in FIG. 9A taken along section line V—V.
Figure 9C:
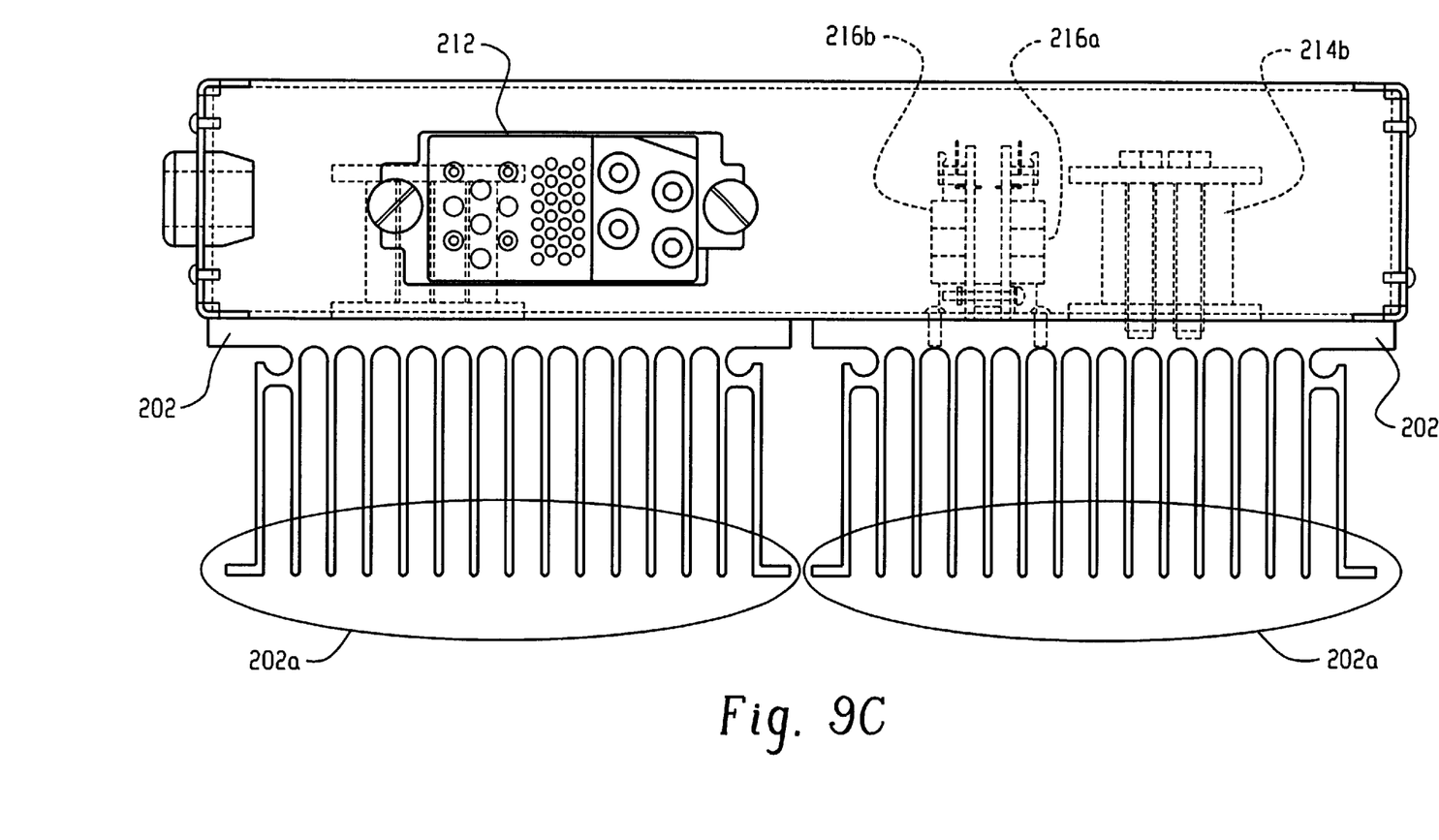

With reference to FIGS. 9A through 9C and continuing reference to FIG. 2, the layout for a preferred implementation of the second modules 140 is shown. The second modules 140 are contained inside an outer housing similar to the one employed for the first modules. The full bridge configuration of switching devices 142 is preferably implemented using a pair of IGBT components 200 which are secured to heatsinks 202 having a plurality of air cooled fins 202a on the outside thereof. As with the first modules, alternately, the second modules 140 are liquid cooled.

Each IGBT component 200 includes a half bridge configuration of IGBT switches. The two IGBT components 200 are electrically connected via PCB 204 to form the full bridge within the second module 140. Optionally, PCB 204 also includes circuitry thereon for controlling transient voltages.

The second modules 140 are controlled via an interface circuit on a switch interface PCB 206 accessed from outside the modules by pin connectors extending through the housing. In a preferred embodiment, transformers 208, electrically connected between the switch interface PCB 206 and the IGBT components 200, are used to drive and/or control the switching devices 142 in accordance with the waveform desired. Alternately, other driving devices are employed.

To monitor and protect against overheating, thermosensors 210 are mounted on the heatsinks 202. They monitor the temperature of the heatsinks 202 and return electrical signals indicative thereof to the switch interface PCB 206. When potential overheating is detected in the second module 140, it is shutdown or other appropriate action is taken to prevent damage to the electrical components therein.

In a preferred configuration each second module 140 is connected, via connector 212, to four first modules 60 as demonstrated in FIG. 2. The first modules 60 connected in parallel for the positive side of the second module 140 are connected through sharing inductors 145 implemented via inductor assemblies 214a. Likewise, inductor assemblies 214b are used to implement the sharing inductors 145 for the negative side. The sharing inductors 145 account for slight differences in the gains between first modules 60 and prevent one first module 60 from driving current into another first module 60.

As a means of protection, the output from each first module 60 is passed through a pair of current limit sensors 216a and 216b. Accordingly, shut down of the amplifier 20 or selected first or second modules, 60 or 140, is effected in an orderly manner in the case of a component failure or other fault condition indicated by a current measurement outside defined parameters. In each pair, current limit sensor 216a checks for positive current faults and current limit sensor 216b checks for negative current faults.

In a preferred configuration, the outputs from the second modules 140 are combined to provide the full rated current of the amplifier 20.

Ultimately, the bipolar waveform is applied to the gradient coil 22 via a gradient lead filter box 150 which serve as a connection point to the gradient coil 22 and inhibits unwanted noise in the NMR imaging bandwidth from reaching the gradient coil 22.

A current transducer 160 monitors the actual current flowing through the gradient coil 22. This is then compare to the current that was demanded. In response to the comparison, a control signal is generated and fed back to the gradient amplifier 20. The control signal is then used to command the gradient amplifier 20 such that the actual current level is adjusted to that demanded.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. In an MRI scanner including a gradient coil for producing a gradient in a main magnetic field of the MRI scanner, a gradient amplifier for driving the gradient coil, said gradient amplifier comprising:

a number of first modules which provide unipolar PWM control of an input supplied thereto to generate a unipolar waveform;

a high voltage DC power supply electrically connected to the first modules to supply the input to the first modules; and, at least one second module electrically connected to an output of the first modules, said second module selectively providing polarity switching of the unipolar waveform output from the first modules to generate a bipolar waveform which drives the gradient coil.

2. The gradient amplifier according to claim 1, wherein each first module comprises:
a half bridge configuration of switching devices.

3. The gradient amplifier according to claim 2, wherein the switching devices are controlled via isolating drive transformers.

4. The gradient amplifier according to claim 2, wherein the switching devices are selected from a group consisting of power MOSFETs, IGBTs, thyristors, and bipolar power transistors.

5. A gradient amplifier for driving a magnetic gradient producing coil of an MRI scanner, said gradient amplifier comprising:
an electrical power supply;
a number of first modules which provide unipolar PWM control of an input supplied thereto from the electrical power supply to generate a unipolar waveform, said first modules each including an electrical filter which filters the input from the electrical power supply, said electrical filter including an inductor assembly and a capacitance, wherein the capacitance further operates to locally store energy in the first modules for use thereby; and,
at least one second module electrically connected to an output of the first modules, said second module selectively providing polarity switching of the unipolar waveform output from the first modules to generate a bipolar waveform which drives the magnetic gradient producing coil.

6. The gradient amplifier according to claim 1, wherein the first modules are electrically connected in parallel such that each first module shares a portion of a total current through the gradient coil.

7. The gradient amplifier according to claim 1, wherein the first modules are electrically connected in series such that the first modules have a composite output voltage which is a vector sum of their individual output voltages.

8. An amplifier for driving a magnetic gradient producing coil of an MRI scanner, said amplifier comprising:
an electrical power supply;
a number of first modules which provide unipolar PWM control of an input supplied thereto from the electrical power supply to generate a unipolar waveform, said first modules being electrically connected in series such that they have a composite output voltage which is a vector sum of their individual output voltages;
a ground connection which electrically grounds a midpoint between the series connected first modules; and,
at least one second module electrically connected to an output of the first modules, said second module selectively providing polarity switching of the unipolar waveform output from the first modules to generate a bipolar waveform which drives the magnetic gradient producing coil.

9. The gradient amplifier according to claim 2, wherein diodes are connected in anti-parallel with the switching devices.

10. The gradient amplifier according to claim 1, wherein the second module comprises:
a full bridge configuration of switching devices.

11. The gradient amplifier according to claim 10, wherein the switching devices are selected from a group consisting of IGBTs, bipolar power transistors, power MOSFETs, thyristors, and GTO thyristors.

12. An amplifier for driving a magnetic gradient producing coil of an MRI scanner, said amplifier comprising:
an electrical power supply;
a number of first modules which provide unipolar PWM control of an input supplied thereto from the electrical power supply to generate a unipolar waveform; and,
at least one second module electrically connected to an output of the first modules, said second module selectively providing polarity switching of the unipolar waveform output from the first modules to generate a bipolar waveform which drives the magnetic gradient producing coil;
wherein a maximum output of the amplifier is selectively changed by varying the number of first modules.

13. A method of generating magnetic gradients in a main magnetic field of an MRI scanner, said method comprising:
(a) generating a high voltage DC current;
(b) pulse width modulating the high voltage DC current to produce a unipolar waveform;
(c) selectively reversing a polarity of the unipolar waveform to generate a bipolar waveform; and,
(d) applying the bipolar waveform to a gradient coil of the MRI scanner.

14. The method according to claim 13, wherein step (b) comprises:
controlling a plurality of switching devices which are divided into separate electrically connected modules, each module including a half bridge configuration of switching devices.

15. The method according to claim 14, wherein the step of controlling includes driving the plurality of switching devices with isolating drive transformers.

16. The method according to claim 14, wherein the step of controlling includes using a non-floating electrical supply to control the plurality of switching devices.

17. The method according to claim 14, wherein the pulse width modulating has a duty cycle of between 0 and 100% inclusive.

18. A method of generating magnetic gradients in a main magnetic field of an MRI scanner, said method comprising:
(a) generating a high voltage DC current;
(b) controlling a plurality of switching devices which are divided into separate electrically connected modules such that a unipolar waveform is produce via pulse width modulation of the high voltage DC current;
(c) filtering the high voltage DC current within each of the separate modules;
(d) storing energy from the high voltage DC current locally within each of the separate modules for use thereby;
(e) selectively reversing a polarity of the unipolar waveform to generate a bipolar waveform; and,
(f) applying the bipolar waveform to a gradient coil.

19. The method according to claim 18, wherein the method further comprises:
storing regenerated energy from the gradient coil locally within each of the separate modules for use thereby.

20. The method according to claim 14, wherein the modules are electrically connected in one of series, parallel, or both series and parallel.

21. A method of generating magnetic gradients in a main magnetic field of an MRI scanner, said method comprising:
(a) generating a high voltage DC current;
(b) controlling a plurality of switching devices which are divided into separate electrically connected modules such that a unipolar waveform is produce via pulse width modulation of the high voltage DC current, said modules being electrically connected in one of series, parallel, or both series and parallel;

(c) grounding series connected modules at their electrical midpoint;

(d) selectively reversing a polarity of the unipolar waveform to generate a bipolar waveform; and, (e) applying the bipolar waveform to a magnetic gradient producing coil.

22. The method according to claim 14, wherein the method further comprises:

protecting the separate modules from excessive amounts of the high voltage DC current.

23. The method according to claim 13, wherein step (c) comprises:

controlling a plurality of switching devices which are divided into separate electrically connected modules, each module including a full bridge configuration of switching devices.

24. A method of generating magnetic gradients in a main magnetic field of an MRI scanner, said method comprising:

(a) generating a high voltage DC current;

(b) controlling a plurality of switching devices which are divided into a number of separate electrically connected modules such that a unipolar waveform is produce via pulse width modulation of the high voltage DC current;

(c) selectively varying the number of modules such that a maximum output therefrom is selectively changed;

(d) selectively reversing a polarity of the unipolar waveform to generate a bipolar waveform; and, (e) applying the bipolar waveform to a magnetic gradient producing coil.

* * * * *